US010381259B2

(12) United States Patent
Kalnitsky et al.

(10) Patent No.: US 10,381,259 B2
(45) Date of Patent: Aug. 13, 2019

(54) SEMICONDUCTOR DEVICE WITH LOCALIZED CARRIER LIFETIME REDUCTION AND FABRICATION METHOD THEREOF

(71) Applicant: TAIWAN SEMICONDUCTOR MANUFACTURING COMPANY, LTD., Hsinchu (TW)

(72) Inventors: Alex Kalnitsky, San Francisco, CA (US); Chih-Wen Yao, Hsinchu (TW); Jun Cai, Scarborough, ME (US); Ruey-Hsin Liu, Hsinchu (TW); Hsiao-Chin Tuan, Judong County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 47 days.

(21) Appl. No.: 15/614,030

(22) Filed: Jun. 5, 2017

(65) Prior Publication Data
US 2017/0271199 A1   Sep. 21, 2017

Related U.S. Application Data

(62) Division of application No. 13/308,957, filed on Dec. 1, 2011, now Pat. No. 9,698,044.

(51) Int. Cl.
*H01L 21/265* (2006.01)
*H01L 21/762* (2006.01)
(Continued)

(52) U.S. Cl.
CPC .. *H01L 21/76237* (2013.01); *H01L 21/26506* (2013.01); *H01L 21/823481* (2013.01);
(Continued)

(58) Field of Classification Search
CPC ......... H01L 21/26506; H01L 21/76213; H01L 21/76216; H01L 21/76218;
(Continued)

(56) References Cited

U.S. PATENT DOCUMENTS 4,835,115 A * 5/1989 Eklund ................. H01L 21/763
257/510
5,344,787 A * 9/1994 Nagalingam ..... H01L 21/26586
257/E21.345
(Continued)

FOREIGN PATENT DOCUMENTS

CN       1992346       7/2007
CN       101312191     11/2008

OTHER PUBLICATIONS

Ker, Ming-Dou et al. "The Impact of Inner Pickup on ESD Robustness of Multi-Finer NMOS in Nanoscale CMOS Technology", IEEE 44th Annual International Reliability Physics Symposium, 2006, pp. 631-632.

*Primary Examiner* — Mohsen Ahmadi
*Assistant Examiner* — Christopher M Roland
(74) *Attorney, Agent, or Firm* — Hauptman Ham, LLP

(57) ABSTRACT

A method of fabricating a semiconductor structure includes forming an isolation feature in a substrate, removing a portion of the isolation feature and a portion of the substrate underneath the removed portion of the isolation feature to form a trench in the substrate, and forming a trapping feature around a bottom portion of the trench. A first sidewall and a second sidewall of the trench are in direct contact with the isolation feature, and a bottom surface of the trench is below a bottom surface of the isolation feature.

16 Claims, 15 Drawing Sheets

(51) Int. Cl.
  *H01L 21/8238* (2006.01)
  *H01L 27/092* (2006.01)
  *H01L 21/8234* (2006.01)
  *H01L 29/10* (2006.01)

(52) U.S. Cl.
  CPC .. *H01L 21/823878* (2013.01); *H01L 27/0921* (2013.01); *H01L 29/1087* (2013.01); *H01L 21/26586* (2013.01); *H01L 21/76213* (2013.01); *H01L 21/76216* (2013.01); *H01L 21/76218* (2013.01); *H01L 21/82385* (2013.01); *H01L 21/823456* (2013.01)

(58) Field of Classification Search
  CPC ....... H01L 21/76237; H01L 21/823481; H01L 21/823878; H01L 27/0921; H01L 21/76224
  See application file for complete search history.

(56) References Cited

U.S. PATENT DOCUMENTS

| | | | |
|---|---|---|---|
| 5,525,824 A | 6/1996 | Himi et al. | |
| 5,637,529 A * | 6/1997 | Jang | H01L 21/02233 438/442 |
| 5,770,504 A | 6/1998 | Brown et al. | |
| 6,514,833 B1 * | 2/2003 | Ishida | H01L 21/76237 257/E21.551 |
| 7,176,104 B1 | 2/2007 | Chen et al. | |
| 2001/0012675 A1 * | 8/2001 | Wu | H01L 21/76224 438/435 |
| 2004/0009636 A1 * | 1/2004 | Ichinose | H01L 21/76224 438/199 |
| 2004/0036142 A1 * | 2/2004 | Shima | H01L 21/76224 257/510 |
| 2004/0157406 A1 * | 8/2004 | Ibara | H01L 21/3081 438/435 |
| 2005/0066887 A1 | 3/2005 | Saitoh | |
| 2005/0085081 A1 * | 4/2005 | Liaw | H01L 21/84 438/704 |
| 2006/0017132 A1 | 1/2006 | Birner | |
| 2006/0148194 A1 | 7/2006 | Lim | |
| 2006/0267134 A1 | 11/2006 | Tilke et al. | |
| 2007/0158694 A1 | 7/2007 | Kim | |
| 2007/0170517 A1 * | 7/2007 | Furukawa | H01L 21/76237 257/372 |
| 2008/0265363 A1 * | 10/2008 | Gambino | H01L 21/76229 257/510 |
| 2008/0290420 A1 | 11/2008 | Yu | |
| 2009/0166744 A1 | 7/2009 | Kim et al. | |
| 2012/0153350 A1 | 6/2012 | Kronholz | |
| 2013/0032882 A1 * | 2/2013 | Salcedo | H01L 27/0921 257/355 |
| 2016/0268371 A1 * | 9/2016 | Okano | H01L 29/78 |

\* cited by examiner

SEMICONDUCTOR DEVICE WITH LOCALIZED CARRIER LIFETIME REDUCTION AND FABRICATION METHOD THEREOF

PRIORITY CLAIM

The present application is a divisional of U.S. application Ser. No. 13/308,957, filed Dec. 1, 2011, which is incorporated herein by reference in its entirety.

TECHNICAL FIELD

The disclosure relates generally to a semiconductor structure and, more particularly, to high voltage devices and methods for forming a high voltage devices.

BACKGROUND

High-voltage devices or power devices are commonly used as switches or rectifiers in power electronic circuits or in integrated circuits. Some common power devices are the power diode, thyristor, power metal-oxide-semiconductor field-effect transistor (MOSFET), bipolar junction transistor (BJT) and insulated gate bipolar transistor (IGBT). A power diode or MOSFET operates on similar principles to its low-power counterpart, but is able to carry a larger amount of current and typically is able to support a larger reverse-bias voltage in the off-state. High-voltage devices are increasingly made smaller and smaller, reducing dimensions of various features. As the dimensions decrease, the high-voltage devices become increasingly susceptible to interference between adjacent power devices by unwanted cross talk between adjacent devices. In many instances, the cross talk is caused by lateral parasitic substrate current.

The interference between adjacent power devices also manifests as parasitic structure formation forming a latchup circuit between the power devices. A latchup circuit is a type of short circuit with a low-impedance path between parasitic structures. The parasitic structure is usually equivalent to a thyristor, a PNPN structure which acts as a PNP and an NPN transistor stacked next to each other. During a latchup, when one of the transistors is conducting, the other one begins conducting too. They both keep each other in saturation for as long as the structure is forward-biased and some current flows through it. A latchup circuit can cause a product to fail.

Electronic design includes a latchup rule that describes a minimum distance between two devices, sometimes between two isolation structures, to reduce or eliminate the likelihood of a latchup between devices. High-voltage devices use a larger latchup rule. If kept constant, this minimum distance prevents significant size reductions of circuits containing high-voltage devices. Thus, smaller latchup resistant or latchup proof semiconductor structure designs and methods for making the same continue to be sought.

BRIEF DESCRIPTION OF THE DRAWINGS

Aspects of the present disclosure are best understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
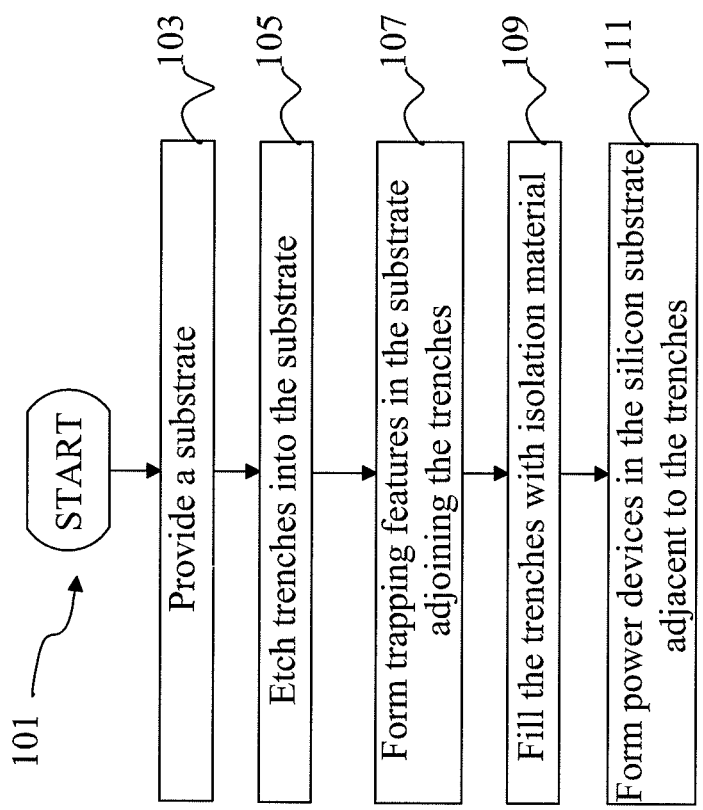
FIG. 1 is a flowchart of a method of forming a semiconductor structure having a latchup resistant structure according to one or more embodiments of this disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

FIG. 1 is a flowchart of a method 101 of forming a semiconductor structure having a latchup resistant structure according to one or more embodiments of this disclosure. In operation 103, a substrate is provided. The substrate is usually a silicon substrate, but may be other semiconductor substrates such as silicon carbide (SiC), silicon dioxide, aluminum oxide, sapphire, germanium, gallium arsenide (GaAs), or indium phosphide (InP). These serve as the foundation upon which power devices such as transistors and diodes are deposited.

In operation 105, trenches are etched into the substrate. The trenches may be shallow or deep and are used to form isolation features in subsequent operations. The trenches divide the substrate into different regions for power devices, which are formed next to the trenches. In some embodiments, one trench is used between power devices. In other embodiments, two or more trenches are used between power devices. Depending on the shape of trenches, various techniques may be used to etch the trenches. A pattern is formed on the substrate surface to protect portions on which the power devices will be formed. The pattern may be formed as a dielectric layer that is subsequently etched to form the pattern. The pattern may also be formed by a photoresist. For shallow trenches, a photoresist pattern covers portions of the substrate, usually in a grid/mesh pattern. The substrate is then subjected to dry etching or wet etching. Plasma assisted dry etch is used for deep trenches. Shallow trenches may be etched using dry etch or wet etch methods. Different etch methods and process parameters allow different trench shapes to form. For example, a process parameter may allow under etch to occur, where edge portions of the protected substrate may be etched in addition to unprotected substrate. Plasma etch techniques are used with biasing of the substrate to direct the etchants at a normal angle into the substrate such that a substantially vertical trench without much under etch is formed. Because of process limitations, a deep trench is usually formed with a small incline angle such that the bottom of the trench is smaller than the opening. For shallow trenches, the trench shape can be made substantially rectangular. The size and shape of trench depends on the amount of isolation desired between the power devices. When two trenches are formed between power devices, a latchup rule determines the minimum distance between nearest edges of the two trenches. In other words, a smaller latchup rule allows the power devices to be placed closer together and more devices may be packed in a die.

In operation 107, trapping features are formed in the substrate adjoining the trenches. The trapping features reduce carrier lifetimes during device operation. Holes and electrons that form parasitic substrate current are recombined or absorbed at the trapping features. The addition of trapping features improves the effectiveness of the isolation features and reduces interference and likelihood of forming a latchup circuit between the power devices. As result, the latchup rule may be made smaller without increasing the likelihood of a latchup.

The trapping features are formed around the bottom of the trenches, in the substrate lining the trenches both on the sidewalls and at the bottom, or a portion of the substrate on the sidewalls. A portion of the substrate is processed to include additional material to form trapping features. The additional materials include germanium, carbon, or an inert gas species. In various embodiments, incorporating the additional material introduce lattice defects and strains in the substrate that provides additional carrier recombination sites.

In one aspect, the trapping features are formed by implanting the bottom of the trenches with one or more dopants. Germanium, carbon, and inert gas species, such as nitrogen, neon, argon, krypton, or xenon may be used. In one example, the dopant species is germanium at an implant dose greater than about $1E14/cm^2$ or about $5E14/cm^2$ or greater, resulting in a dopant concentration of between about $1E16/cm^3$ to about $1E21/cm^3$. An implant system accelerates ions in an electric field and implants the ion into the substrate. Each individual ion produces on impact many point defects in the substrate crystal structure, such as vacancies and interstitials. Vacancies are crystal lattice points unoccupied by an atom: in this case the ion collides with a target atom, resulting in transfer of a significant amount of energy to the target atom such that it leaves its crystal site. This target atom then itself becomes a projectile in the substrate, and can cause successive collision events. Interstitials result when such atoms (or the original ion itself) come to rest, but find no vacant space in the lattice to reside. These point defects can migrate and cluster with each other, resulting in dislocation loops and other defects. Lastly, the ion can replace an atom in the crystal structure, but because the ion used is not the same material as the substrate, the resulting lattice constant is different from the original. This difference causes strain.

The implantation creates a concentration profile in the substrate to form the trapping features. The substrate may be annealed after the implantation, at a temperature of up to 1000 degrees Celsius. The trapping feature has a footprint larger than the bottom of the trench and is at least 10 nm deep and may be up to a few microns deep. For example, a peak density may be at about 10 nm with a long tail of at least one micron.

In another aspect, the trapping feature may be grown at the bottom of the trench using selective epitaxy. The sidewalls of the trench are first protected by a conformal liner layer. The liner layer is a dielectric material such as a thermally deposited silicon oxide, or atomic layer silicon oxide or silicon nitride. A bottom area of the liner layer is then etched to expose the substrate. A trapping feature is then grown epitaxially from the bottom area. The trapping feature may be germanium, silicon germanium, or graphene (an allotrope of carbon). A trapping feature form in this aspect may be several nanometers thick. After the selective epitaxial process, the substrate may be annealed.

In yet another aspect, the trapping feature may be formed on all surfaces in the trench using chemical vapor deposition processes. In some embodiments, atomic layer deposition (ALD) process forms very thin and conformal layers of material that may be a few atoms thick, at a few angstroms. Repeated ALD processes can form a conformal layer up to several nanometers. ALD can deposit germanium, silicon germanium or carbon. Plasma assisted (PA) or plasma enhanced (PE) CVD may also be used to deposit a conformal layer, though not as thin as ALD. Amorphous carbon can be deposited using PACVD. After the conformal layer is formed, the substrate is annealed at a high temperature, up to about 1000 degrees Celsius.

Referring back to FIG. 1, in operation 109, the trenches are filled with isolation material. The isolation material is usually silicon oxide deposited using high density plasma (HDP) CVD. HDPCVD is used to deposit in trenches having high aspect ratios by concurrent deposition and etching. As material is deposited into the bottom of the trench, plasma etching keeps overhangs at the opening of the trench from closing the opening. Once the trenches are filled, then the power devices are formed in the silicon substrate adjacent to the trenches in operation 111. Depending on the type of power device, the device typically involves multi-step implantation of different materials into the substrate, forming various electrodes and gates over the substrate, and may also include forming additional isolation features. The power devices are generally transistors or diodes. Power transistors include high electron mobility transistors (HEMTs), power MOSFETs, and bipolar junction transistors (BJTs). Power diodes include Schottky diodes and other high voltage diodes.

Figure 2:
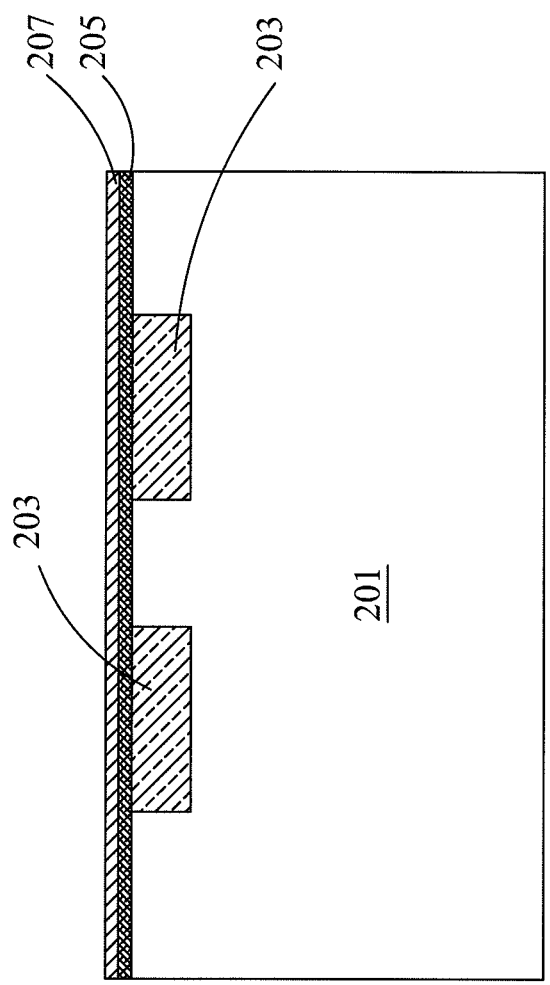
FIGS. 2 to 9C are cross-sectional views of a semiconductor structure at various stages of manufacture according to some embodiments of the method of FIG. 1.

FIGS. 2 to 9C shows cross-sectional views of a semiconductor structure at various stages of manufacture according to some embodiments of the method of FIG. 1. In FIG. 2, silicon substrate 201 has a p-type conductivity. The p-type substrate may be formed by implanting p-type dopants in a bare silicon wafer, or by incorporating p-type dopants during silicon-on-insulator processing. On the p-type substrate shallow trench isolation features 203 are defined, etched, and filled. The wafer is then planarized. A pad oxide layer 205 and a silicon nitride layer 207 are then deposited over the substrate and the STI features 203 using CVD processes to protect the surface of substrate 201 during subsequent processing.

Figure 3:
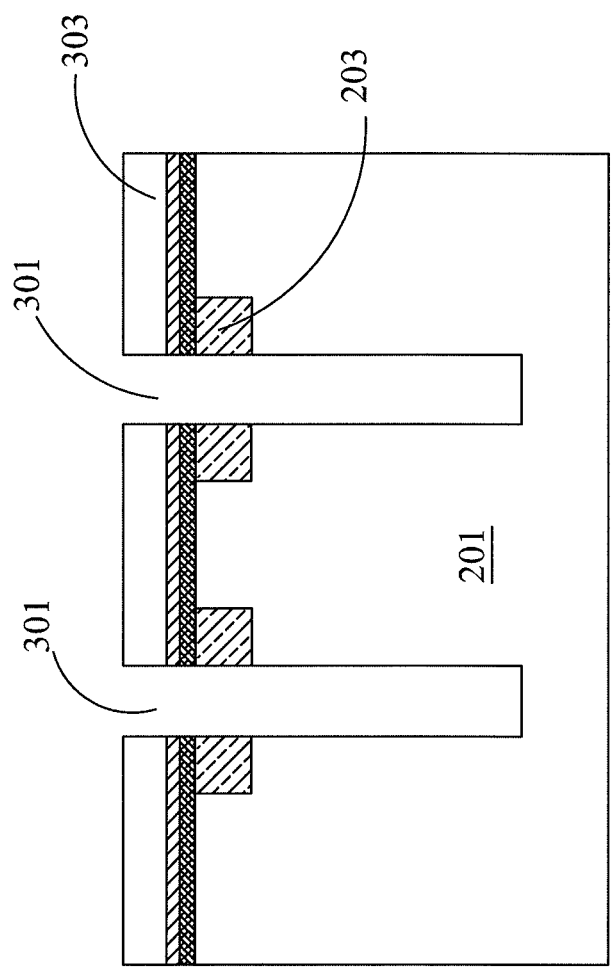

FIG. 3 shows a patterned photoresist layer 303 over the substrate 201. Trenches 301 are etched into the substrate 201. As shown, trenches 301 have high aspect ratios and are used to form deep trench isolation (DTI) features. Note that while the DTI is shown formed through STI features 203, the STI features may not be used. In some embodiments, the STI features 203 may be on one side of the trench only or omitted. In still other embodiments the trapping features are formed adjoining the STI features 203 instead of the DTI.

Figure 4A:
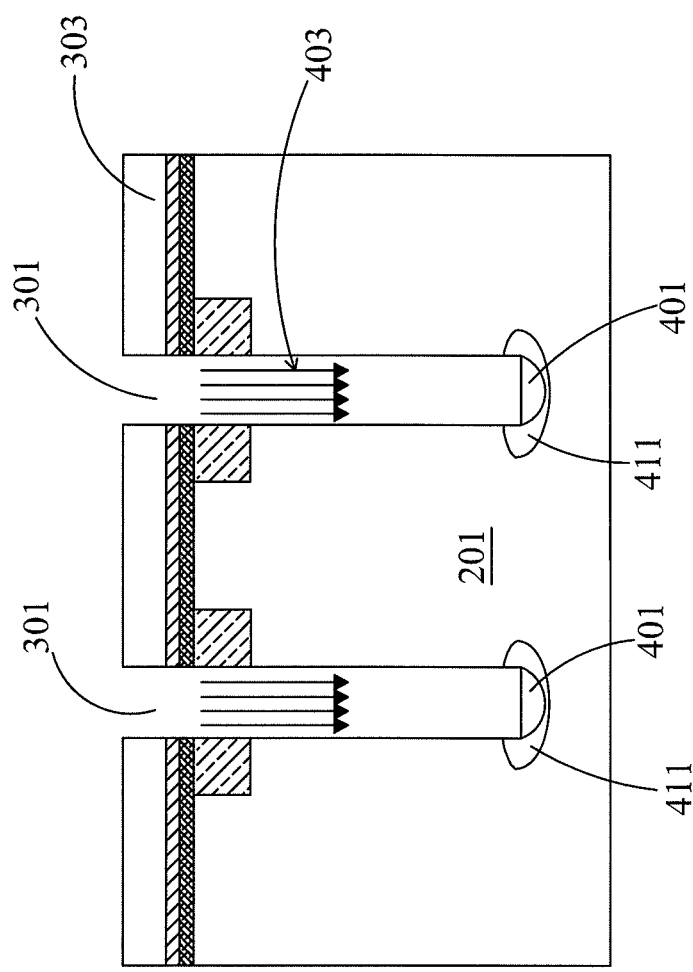
Figure 4B:
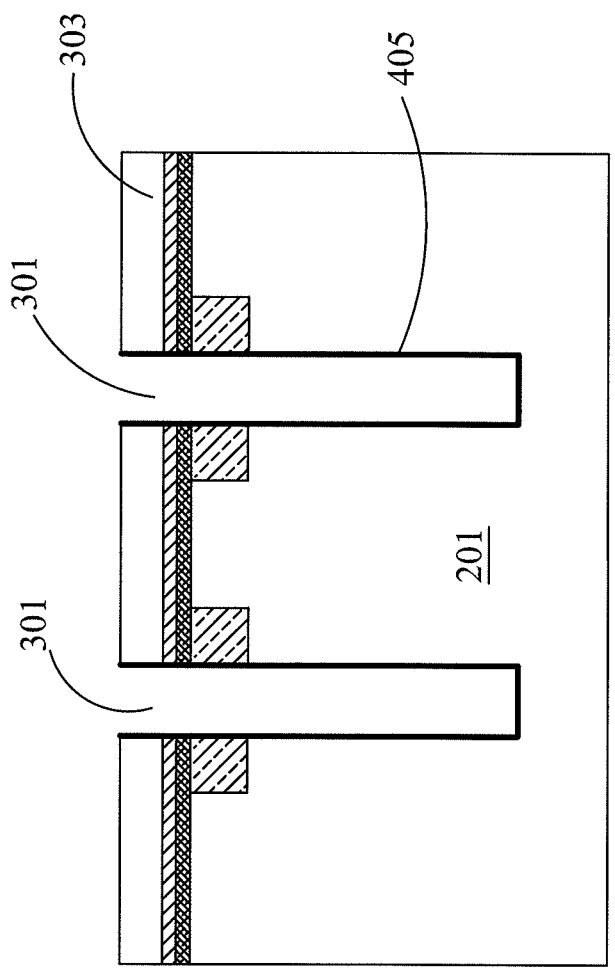
Figure 4C:
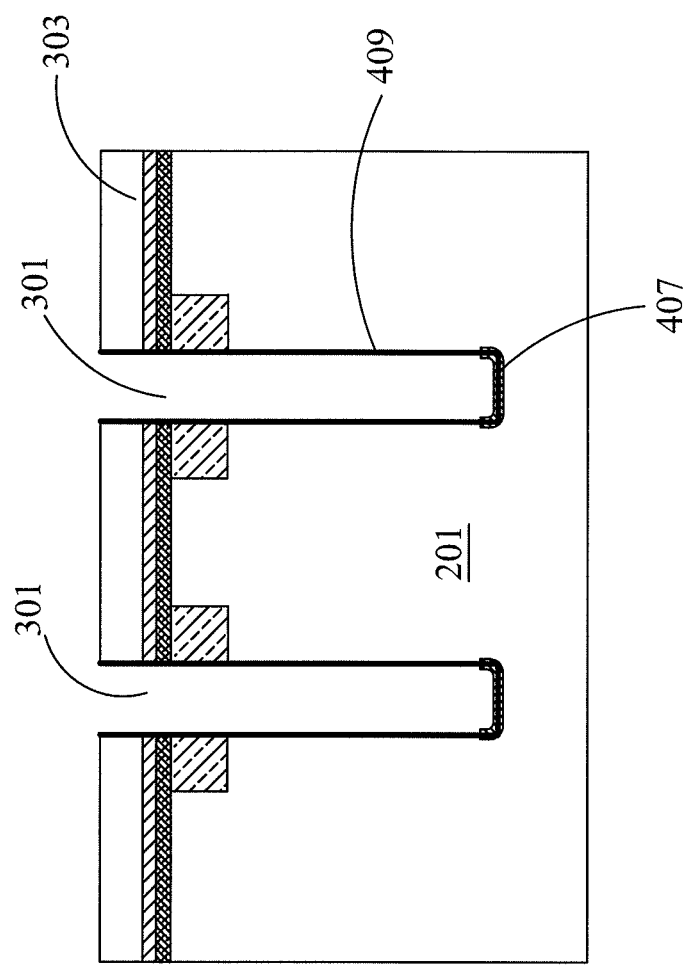

FIGS. 4A, 4B, and 4C shows different types of trapping features are formed using different processes. FIG. 4A shows various embodiments where the trapping features are formed using an implantation process. In FIG. 4A, germanium, carbon, or an inert gas species is implanted into the bottom of the trench 301 as shown by energy arrows 403, with the photoresist layer 303 in place. The implantation creates trapping features 401 in the substrate portion adjoining the bottoms of trenches 301. Depending on the aspect ratio and angles of implantation, some material may be implanted in the sidewalls close to the bottom and along the sidewalls of the trenches 301. According to certain embodiments, the implantation angle is kept at normal, or straight into the bottoms of trenches 301, so that a majority of the implanted species initially placed directly below the trench bottoms in the substrate 201. After the implantation process, the substrate may be annealed and a somewhat larger trapping area 411 may be formed due to implanted species diffusion/migration. While FIG. 4A shows a particular oval shape for the trapping features 401 and 411, the actual trapping features may have different shapes depending on implantation energy, angles of implantation, and whether the substrate is subsequently annealed and at what temperature. For example, a higher implantation energy would penetrate the implanted species deeper into the substrate and result in a different oval shape. Longer or higher temperature anneal processes would increase the migration.

In certain embodiments where only one isolation feature is used between power devices, the trapping features are made larger but without interfering with power device operation. In other embodiments where two isolation features are used between the power devices, the trapping features cannot be so large as to cover a pick-up region between the power devices.

FIG. 4B shows various embodiments where the trapping features 405 are formed by CVD along the sidewalls and the bottoms of the trenches. Trapping features 405 are formed by first depositing a thin layer of germanium, silicon germanium, or carbon in a conformal manner onto the sidewalls and bottom of the trenches 301. The thin layer is then annealed at a higher temperature greater than 500 degrees Celsius, about 700 degrees Celsius, between about 700 degrees Celsius to about 1000 degrees Celsius, or about 1000 degrees Celsius or greater. The anneal increases the thickness of the trapping feature 405 by incorporating the film species into the silicon substrate. Deposited thickness may be on the order of several to over ten and up to 100 nanometers. After annealing, the trapping features 405 may be on the order of several tens of nanometers up to over 200 nanometers.

FIG. 4C shows various embodiments where the trapping feature 407 is epitaxially grown selectively in the bottom of the trenches 301. A conformal liner 409 is first deposited in the trenches 301 along the sidewalls and the bottom. The liner is a dielectric material from which epitaxial film does not grow. The liner is typically silicon oxide and may be other dielectrics such as silicon nitride. A portion of the liner in the bottom is then removed by etching to expose the underlying substrate. Depending on the etching method, more or less of the liner material may be removed.

An epitaxial process is then performed on the exposed substrate to grow a germanium epitaxial film, a silicon germanium epitaxial film, or a graphene film. The process may be metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor-phase epitaxy (Cl-VPE), and/or liquid phase epitaxy (LPE). The film may be annealed to promote diffusion/migration of the germanium or carbon. Note that the various annealing steps described in conjunction with FIGS. 4A to 4C need not occur in the manufacturing processes immediately after the trapping feature formation. Because the substrate may be annealed many times during manufacturing, the anneal steps may be performed later.

Figure 5:
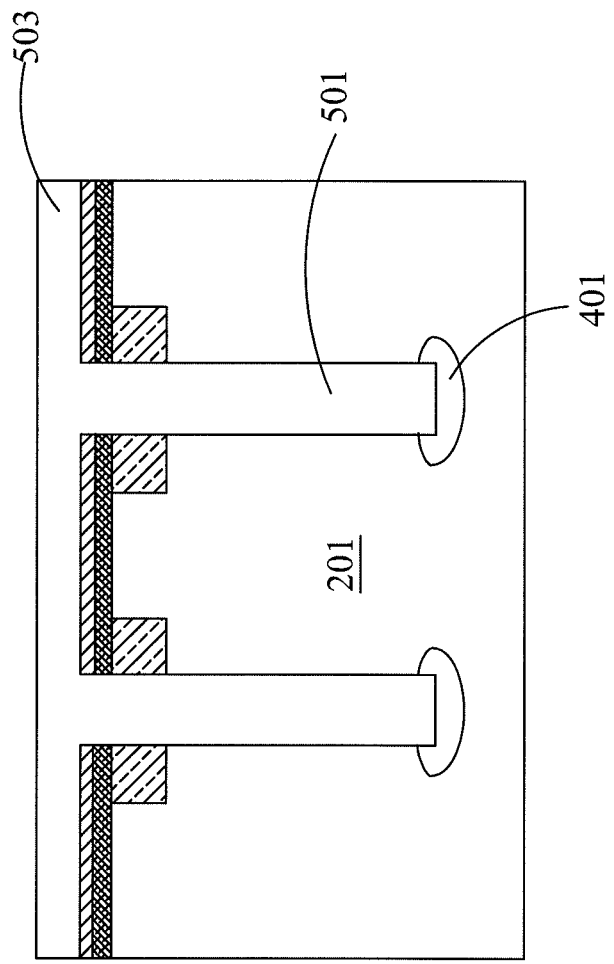

After the initial trapping feature formation, the photoresist layer is removed (stripped) and the trenches 301 are then filled to form isolation features 501 as shown in FIG. 5. The trenches are typically filled with silicon oxide, which is deposited using high density plasma (HDP) CVD. FIG. 5 shows the isolation features 501 and silicon oxide layer 503 in the field above the isolation features 501. To ensure a proper fill without voids, more material is deposited. Removing the photoresist layer before filling the trenches reduces the aspect ratio of the trenches and makes them easier to fill, but removal before filling is not necessary. The photoresist may be removed later.

Figure 6:
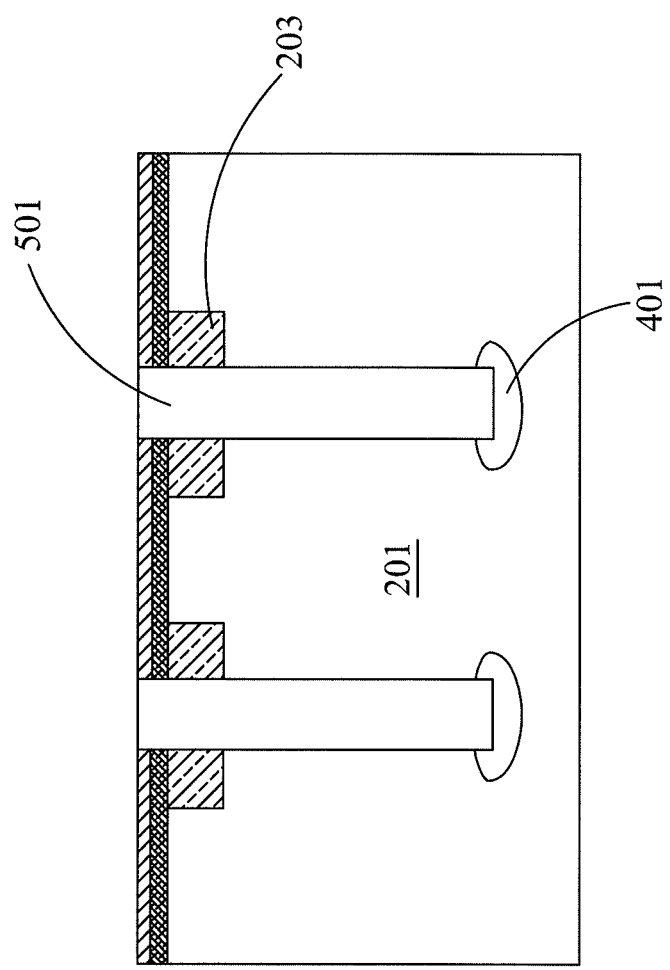
Figure 7:
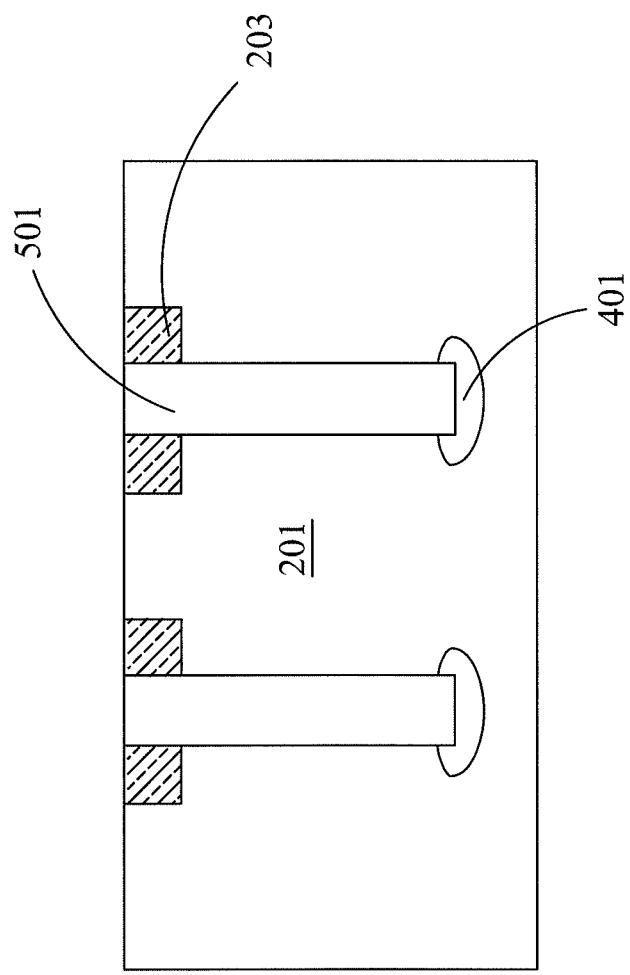

FIG. 6 shows the structure after planarizing the substrate to remove excess silicon oxide layer 503. The planarization is performed using a chemical mechanical polishing process and may include other wet etching operations. The silicon nitride and pad oxide layers are then removed by etching or stripping to expose the substrate between the STI features 203 as shown in FIG. 7. STI features 203 may be doped intentionally or unintentionally in previous or in subsequent steps, leading to the same or to different doping profiles for the various STI features 203. For this reason, each of the STI features 203 is depicted with different shading in the figures below.

Figure 8:
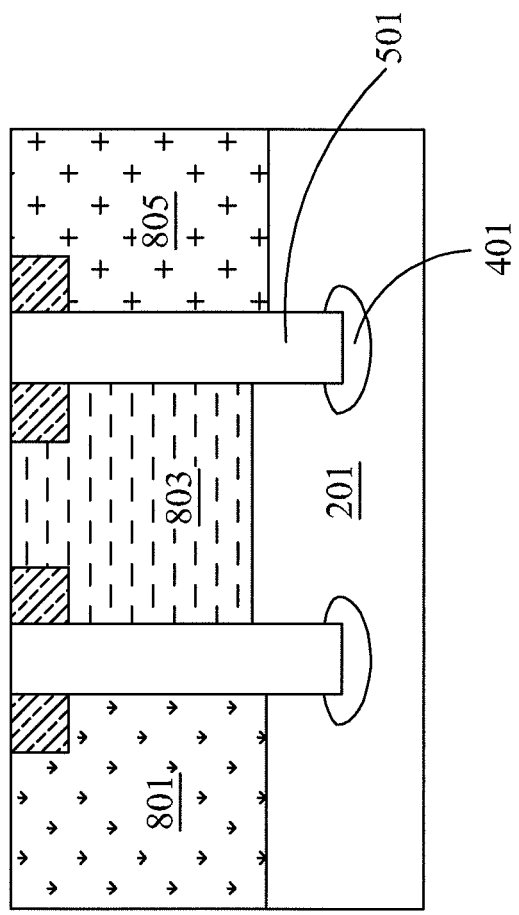

FIG. 8 shows the substrate 201 separated into device regions 801, 803, and 805. In some embodiments, power devices are separated by two isolation features 501. In those embodiments, power devices are formed in regions 801 and 805, but not 803. For example, high voltage n-wells (HVNW) are formed in regions 801 and 805 and a high voltage p-well (HVPW) may be formed in region 803. Power devices are formed over the HVNW in regions 801 and 805, but not over the HVPW in region 803. Region 803 may be used for substrate current pickup. Devices in the various regions 801 and 805 need not be the same type of power devices. The size of region 803 corresponds to the latchup rule minimum distance between the isolation features 501. Use of the trapping features 401 enables a smaller latchup rule so that the size of region 803, which does not include any device, can be reduced. Reduction of regions 803 allows more power devices to be placed in the same sized area.

In other embodiments, power devices are formed in each of regions 801, 803, and 805. Devices in the various regions 801, 803 and 805 need not be the same type of power devices. The isolation features 501 with trapping features 401 are placed between adjacent power devices. In these embodiments, the trapping features 401 sufficiently reduce carrier lifetime and therefore substrate current so that pickup regions are not used between some adjacent regions. However, some pickup regions may still be used in a cluster of power devices. For example, a pickup region may be surrounded by 4 or more power devices.

In one embodiment, a pickup region having isolation features and trapping features may be surrounded by 4 or more power devices. While each power device is separated from an adjacent power device by at least one isolation feature and trapping feature, only one of the separating isolation features adjoins a pickup region. In other words, each power device region is has one pickup region neighbor and rest of its adjacent regions are other power devices.

Figure 9A:
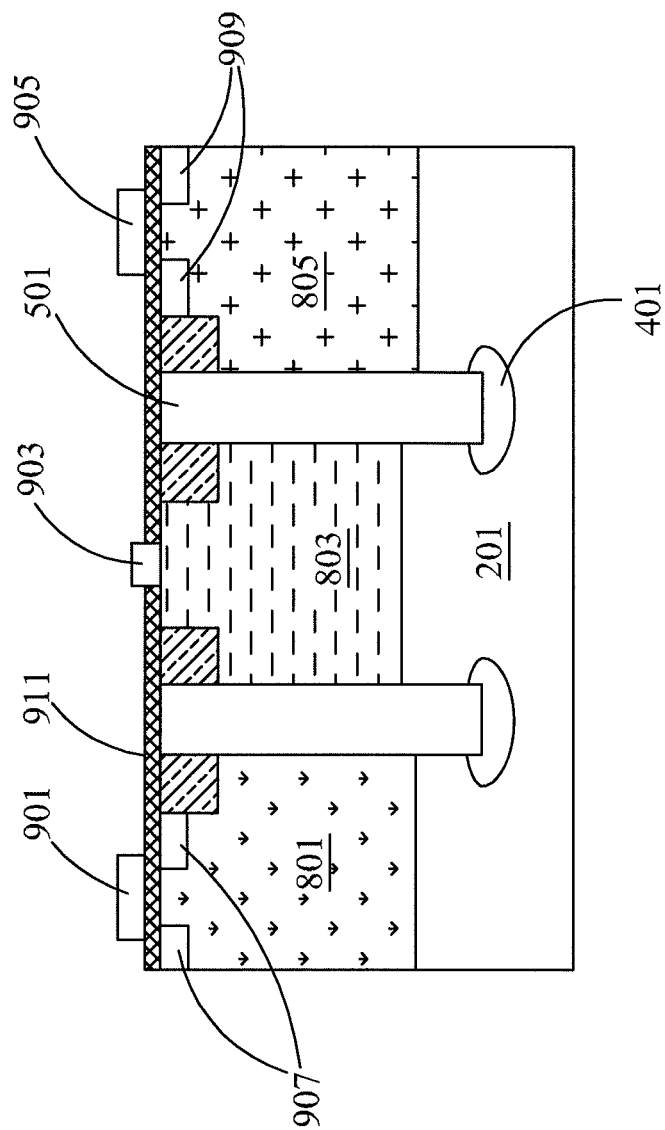
Figure 9B:
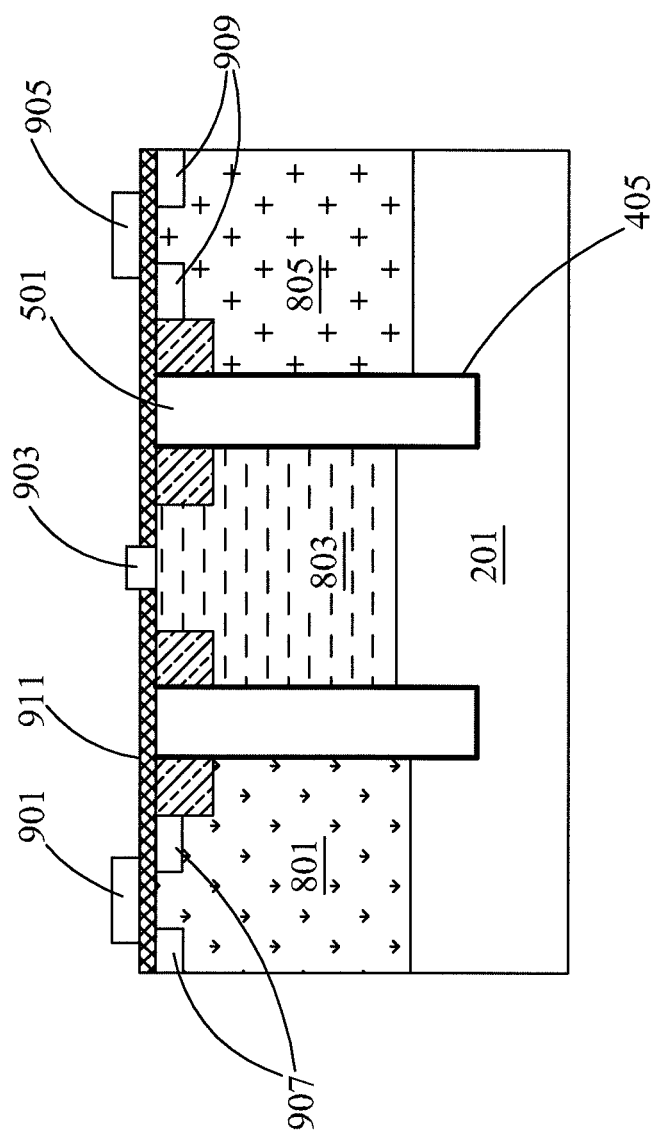
Figure 9C:
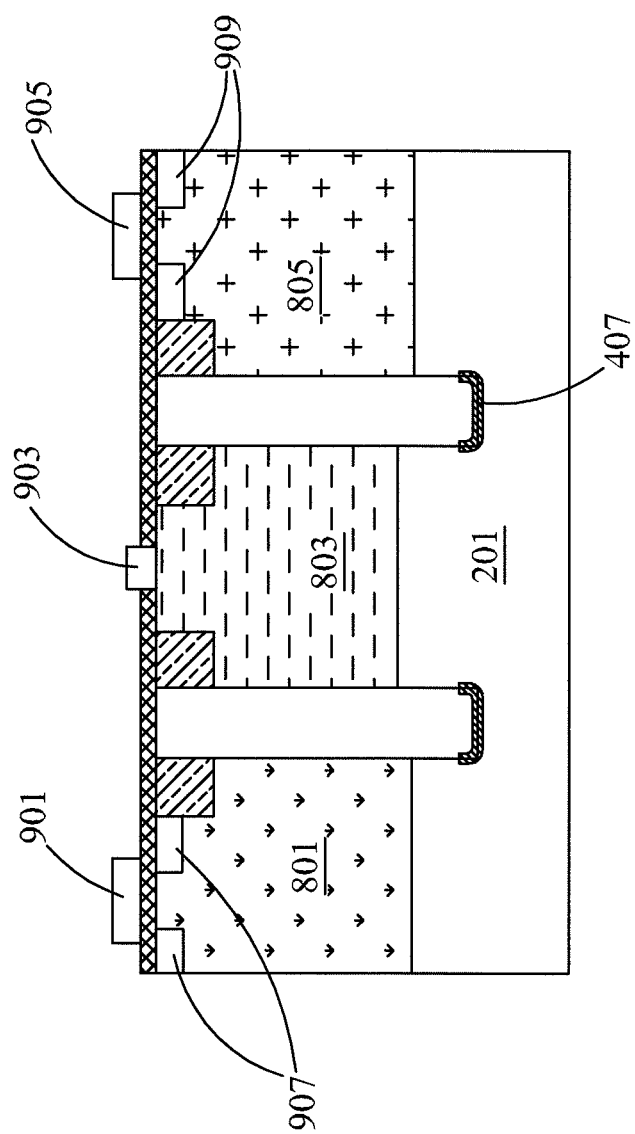

FIGS. 9A, 9B, and 9C show example structures of various embodiments in accordance with the present disclosure. FIG. 9A shows the implanted trapping feature embodiment, with trapping features 401 formed below a bottom of the isolation features 501. Regions 801 and 803 are power devices, with gates 901 and 905 and doped regions 907 and 909. Pickup electrode 903 connects to the substrate in region 803 through dielectric layer 911. Note that in this example, the power device regions are shallower than the trapping features 401. Deeper trapping features 401 reduces the likelihood that the trapping features 401 interfere with power device operation.

FIG. 9B shows the conformal trapping feature embodiment, with trapping features 405 formed on sidewalls and bottom of the isolation features 501. Regions 801 and 803 are power devices, with gates 901 and 905 and doped regions 907 and 909. Pickup electrode 903 connects to the substrate in region 803 through dielectric layer 911.

FIG. 9C shows the epitaxial trapping feature embodiment, with trapping features 407 grown on bottoms of the isolation features 501. Regions 801 and 803 are power devices, with gates 901 and 905 and doped regions 907 and 909. Pickup electrode 903 connects to the substrate in region 803 through dielectric layer 911.

A semiconductor structure according to FIG. 9A was simulated to determine the change in current lifetimes using different implant dosages of germanium. In the simulation, regions 801 and 805 are high voltage n-wells (HVNWs), and region 803 is a high voltage p-well (HVPW). Regions 907 over region 801 are p-doped; and regions 909 over region 805 are also p-doped. Polysilicon gate structures over regions 801 and 805 are formed. A pickup structure is formed over region 803. A BJT was simulated with the region 801 as the emitter, 803 as the base, and 805 as the collector. The simulation provided 4 scenarios of different germanium implantation: $1E14/cm^2$, $5E14/cm^2$, $1E15/cm^2$, and none.

Figure 10:
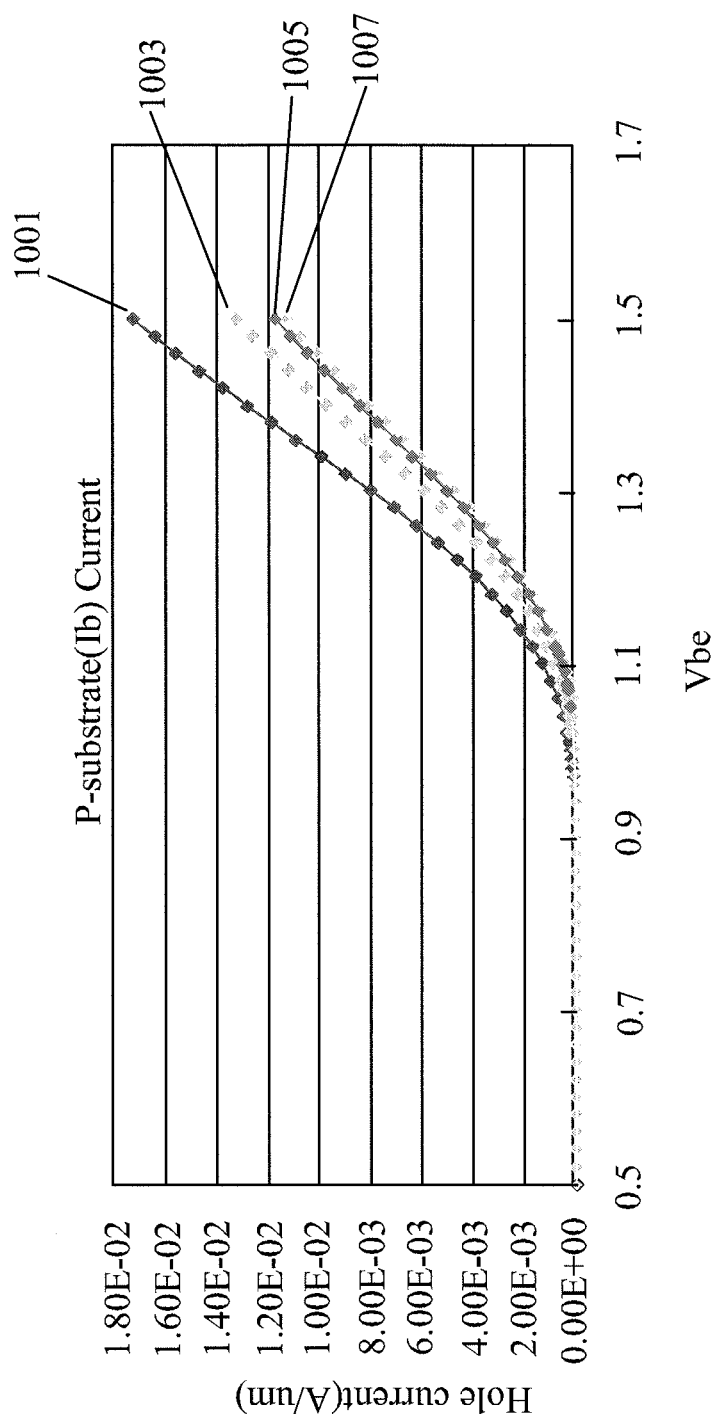
FIGS. 10 and 11 are plots of electrical properties of a semiconductor structure that simulates a bipolar junction transistor (BJT) in accordance with one embodiment of this disclosure.

FIG. 10 shows the hole current for each of the scenarios under different base to emitter voltages (Vbe). The hole current between base and emitter, i.e, between Regions 803 and 801, simulates leakage substrate current. Line 1001 corresponds to the scenario with no germanium implanted. Line 1003 corresponds to the scenario with an implant concentration of $1E14/cm^2$. Line 1005 corresponds to the scenario with an implant concentration of $5E14/cm^2$. Line 1007 corresponds to the scenario with an implant concentration of $1E15/cm^2$. FIG. 10 shows that hole currents are significantly reduced between Lines 1001 and 1003, and somewhat reduced between Lines 1003 and 1005, and slightly reduced between Lines 1005 and 1007. At every Vbe, the hole current between the base and emitter is reduced with additional implant dosage.

Figure 11:
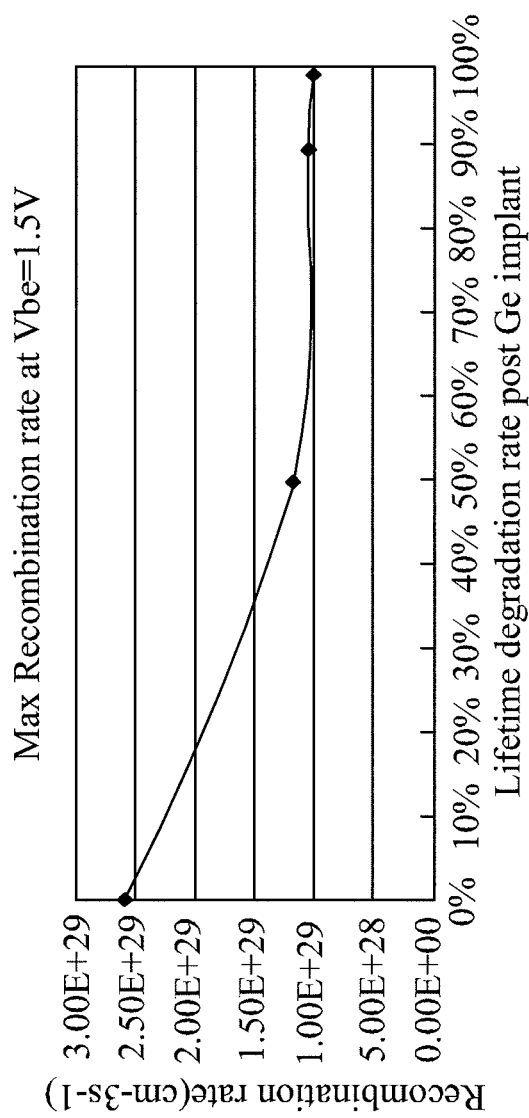

FIG. 11 shows the relationship between different implant doses. FIG. 11 shows the recombination rate (recombination/$cm^3$s) over lifetime degradation rate. Each of the data points of FIG. 11 correspond to one scenario shown as a Line in FIG. 10. In other words, Line 1001 corresponds to the 0% lifetime degradation data point in FIG. 11 because there is no change in carrier lifetimes. Line 1003 corresponds to the approximate 50% lifetime degradation data point in FIG. 11 because there is about 50% carrier lifetime reduction. FIG. 11 shows that the recombination rate reduced significantly with having a trapping feature at any implant dose. However, the recombination rate was not significantly further reduced with additional implant dosage. The simulated data shows that a nominal dose of $1E14/cm^2$ is effective in reducing substrate current and decreasing the recombination rate, but $5E14/cm^2$ is better. Small and perhaps insignificant additional benefit is gained from additional dosage at $1E15/cm^2$. Overall the simulation proves that the trapping features are effective at reducing substrate current. The substrate current reduction reduces the likelihood of a latchup circuit.

Although the embodiments and its advantages have been described in detail, it should be understood that various changes, substitutions and alterations can be made herein without departing from the spirit and scope of the disclosure as defined by the appended claims. Although the various embodiments have been described in terms of high voltage power devices, the trapping features may also be used for isolating devices that are not power devices. Devices operating at lower voltages have less substrate current and therefore are less likely to form a latchup circuit. However, as critical dimensions continues to shrink, better isolation features decrease likelihood of interference between devices and at small enough critical dimensions, isolation features with trapping features can improve circuit performance.

While the simulation shows implant dosage for one embodiment, one skilled in the art would be able to find optimal concentrations and process parameters for different embodiments of the present disclosure. For example, the epitaxial trapping feature having different thicknesses and different silicon to germanium concentrations can be simulated or tested.

One aspect of this description relates to a method of fabricating a semiconductor structure. The method includes forming an isolation feature in a substrate, removing a portion of the isolation feature and a portion of the substrate underneath the removed portion of the isolation feature to form a trench in the substrate, wherein a first sidewall and a second sidewall of the trench are in direct contact with the isolation feature and a bottom surface of the trench is below a bottom surface of the isolation feature, and forming a trapping feature around a bottom portion of the trench. In some embodiments, the forming of the trapping feature around the bottom portion of the trench includes implanting at least one of germanium, carbon or an inert gas species into and adjoining the bottom portion of the trench. In some embodiments, the implanting of the at least one of germanium, carbon or inert gas species includes implanting the at least one of germanium, carbon or inert gas species at a dose greater than $5E14/cm^2$. In some embodiments, the forming of the trapping feature around the bottom portion of the trench includes depositing at least one of germanium, silicon germanium or carbon to form a thin film along the first sidewall, the second sidewall and the bottom surface of the trench using CVD, and annealing the thin film at a temperature of at least 500 degrees Celsius. In some embodiments, the forming of the trapping feature around the bottom portion of the trench includes epitaxially growing at least one of a germanium film, a silicon germanium film or a graphene film on the bottom surface of the trench. In some embodiments, the method further includes depositing a dielectric layer along the first sidewall, the second sidewall and the bottom surface of the trench, and removing a portion of the dielectric layer to expose the bottom surface of the trench. In some embodiments, the method further includes depositing a pad oxide layer over the isolation feature, depositing a silicon nitride layer over the pad oxide, filling the trench with an isolation material, planarizing the substrate to remove an excess portion of the isolation material, removing the silicon nitride layer from the substrate, and removing the pad oxide layer to expose the substrate. In some embodiments, the method further includes forming a first well region and a second well region at opposite sides of the trench, wherein the first well region has a different conductivity type from the second well region and a bottom surface of the first well region is above the bottom surface of the trench.

Another aspect of this description relates to a method of manufacturing a power device. The method includes forming a first STI feature and a second STI feature in a substrate, depositing a pad oxide layer over the first STI and the second STI, depositing a silicon nitride layer over the pad oxide layer, patterning the silicon nitride layer to form a first deep trench in the first STI and a second deep trench in the second STI, wherein an upper portion of the first deep trench is in contact with the first STI and a lower portion of the first deep trench is in contact with the substrate, and an upper portion of the second trench is in contact with the second STI and a lower portion of the second deep trench is in contact with the substrate, forming a trapping feature at a bottom portion of the first deep trench and at a bottom portion of the second deep trench. In some embodiments, the method further includes forming the trapping feature, in the first deep trench, continuously along the first STI and the substrate, and forming the trapping feature, in the second deep trench, continuously along the second STI and the substrate. In some embodiments, the forming of the trapping feature includes depositing at least one of germanium, silicon germanium or carbon to form a thin film conformally along sidewalls and the bottom portion of the first deep trench and along sidewalls and the bottom portion of the second deep trench using ALD, and annealing the trapping feature to increase a thickness of the trapping feature in a range from about several tens of nanometers (nm) to about 200 nm. In some embodiments, the method further includes depositing, at sidewalls of the first trench, a first dielectric liner continuously along the first STI and the substrate, and depositing, at sidewalls of the second trench, a second dielectric liner continuously along the second STI and the substrate. In some embodiments, the forming of the trapping feature at the bottom portion of the first deep trench and at the bottom portion of the second deep trench includes implanting germanium with a dosage ranging from about $1E14/cm^2$ to about $5E14/cm^2$ below the bottom portion of the first deep trench and the bottom portion of the second deep trench, and diffusing the germanium to form an oval shape around the bottom portion of the first deep trench and around the bottom portion of the second deep trench. In some embodiments, the implanting of the germanium below the bottom portion of the first deep trench and the bottom portion of the second deep trench includes implanting the germanium to a depth of at least 10 nm below a bottom surface of the first deep trench. In some embodiments, the method further includes forming a first well region, a second well region and a third well region in the substrate, wherein the first well region and the second well region are separated by the first deep trench, the second well region and the third well region are separated by the second deep trench, and the second well region has a different conductivity from the first well region or the third well region. In some embodiments, the method further includes forming a first device over the first well region, a pickup electrode over the second well region and a third device over the third well region, wherein the pickup electrode is electrically in contact with the second well region. In some embodiments, the method further includes filling the first deep trench and the second deep trench with an isolation material using high density plasma CVD.

Still another aspect of this description relates to a method of fabricating a high-voltage device. The method includes forming a first STI feature in a substrate, forming a deep trench in the first STI feature, wherein sidewalls of the first deep trench are between sidewalls of the first STI, and implanting species to introduce lattice defects and strains in the substrate at a bottom portion of the deep trench. In some embodiments, the method further includes depositing a pad oxide layer over the first STI feature, coating a photoresist over the pad oxide layer, patterning the photoresist to define the deep trench, stripping the photoresist from the substrate, and filling the deep trench with silicon oxide. In some embodiments, the method further includes forming a first well region and a second well region in the substrate, wherein the first well region and the second well region are at opposite sides of the deep trench, and a conductivity of the second well region is different from that of the first well region. In some embodiments, the method further includes forming a second STI feature in the substrate, forming a third well region in the substrate, wherein the third well region and the second well region are at opposite sides of the second STI feature, and forming an emitter at the first well region, a base at the second well region and a collector at a third well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A method of fabricating a semiconductor structure, the method comprising:
   forming an isolation feature in a substrate;
   removing a portion of the isolation feature and a portion of the substrate underneath the removed portion of the isolation feature to form a trench in the substrate, wherein a first sidewall and a second sidewall of the trench are in direct contact with the isolation feature and a bottom surface of the trench is below a bottom surface of the isolation feature;
   forming a trapping feature around a bottom portion of the trench, wherein at least a portion of the trapping feature directly contacts the substrate, and a portion of the first sidewall or the second sidewall below the isolation feature, and the forming the trapping feature around the bottom portion of the trench comprises:
      epitaxially growing at least one of a germanium film, a silicon germanium film or a graphene film on the bottom surface of the trench;
   depositing a dielectric layer along the first sidewall, the second sidewall and the bottom surface of the trench; and
   removing a portion of the dielectric layer to expose the bottom surface of the trench.

2. The method of claim 1, wherein the forming of the trapping feature around the bottom portion of the trench comprises:
  implanting at least one of germanium, carbon or an inert gas species into and adjoining the bottom portion of the trench.

3. The method of claim 2, wherein the implanting the at least one of germanium, carbon or inert gas species comprises:
  implanting the at least one of germanium, carbon or inert gas species at a dose greater than $5E14/cm^2$.

4. The method of claim 1, wherein the forming the trapping feature around the bottom portion of the trench comprises:
  depositing at least one of germanium, silicon germanium or carbon to form a thin film along the first sidewall, the second sidewall and the bottom surface of the trench using chemical vapor deposition (CVD); and
  annealing the thin film at a temperature of at least 500 degrees Celsius.

5. The method of claim 1, further comprising:
  depositing a pad oxide layer over the isolation feature;
  depositing a silicon nitride layer over the pad oxide;
  filling the trench with an isolation material;
  planarizing the substrate to remove an excess portion of the isolation material;
  removing the silicon nitride layer from the substrate; and
  removing the pad oxide layer to expose the substrate.

6. The method of claim 1, further comprising:
  forming a first well region and a second well region at opposite sides of the trench, wherein the first well region has a different conductivity type from the second well region and a bottom surface of the first well region is above the bottom surface of the trench.

7. The method of claim 1, wherein the depositing of the dielectric layer is prior to the forming of the trapping feature.

8. The method of claim 1, wherein the depositing of the dielectric layer comprises depositing silicon oxide or silicon nitride.

9. A method of manufacturing a power device, the method comprising:
  forming a first shallow trench isolation (STI) feature and a second STI feature in a substrate;
  depositing a pad oxide layer over the first STI and the second STI;
  depositing a silicon nitride layer over the pad oxide layer;
  patterning the silicon nitride layer to form a first deep trench in the first STI and a second deep trench in the second STI, wherein an upper portion of the first deep trench is in contact with the first STI and a lower portion of the first deep trench is in contact with the substrate, and an upper portion of the second trench is in contact with the second STI and a lower portion of the second deep trench is in contact with the substrate;
  forming a trapping feature at a bottom portion of the first deep trench and at a bottom portion of the second deep trench, wherein the forming the trapping feature around the bottom portion of the trench comprises:
    epitaxially growing at least one of a germanium film, a silicon germanium film or a graphene film on a bottom surface of the first deep trench;
  depositing a dielectric layer along a first sidewall, a second sidewall and the bottom surface of the first deep trench; and
  removing a portion of the dielectric layer to expose the bottom surface of the first trench; and
  filling the first deep trench and the second deep trench with an insulating material, wherein the trapping feature directly contacts the insulating material and directly contacts the substrate.

10. The method of claim 9, further comprising:
  forming the trapping feature, in the first deep trench, continuously along a bottom surface of the first deep trench; and
  forming the trapping feature, in the second deep trench, continuously along a bottom surface of the second deep trench.

11. The method of claim 9, further comprising:
  forming a first well region, a second well region and a third well region in the substrate, wherein the first well region and the second well region are separated by the first deep trench, the second well region and the third well region are separated by the second deep trench, and the second well region has a different conductivity from the first well region or the third well region.

12. The method of claim 11, further comprising:
  forming a first device over the first well region, a pickup electrode over the second well region and a third device over the third well region, wherein the pickup electrode is electrically in contact with the second well region.

13. A method of fabricating a high-voltage device, comprising:
  forming a first shallow trench isolation (STI) feature in a substrate;
  forming a deep trench in the first STI feature, wherein sidewalls of the first deep trench are between sidewalls of the first STI;
  implanting species to introduce lattice defects and strains in the substrate at a bottom portion of the deep trench;
  epitaxially growing at least one of a germanium film, a silicon germanium film or a graphene film on a bottom surface of the deep trench;
  depositing a dielectric layer along a first sidewall, a second sidewall and the bottom surface of the deep trench; and
  removing a portion of the dielectric layer to expose the bottom surface of the deep trench; and
  filling the deep trench with silicon oxide after the implanting of the species.

14. The method of claim 13, further comprising:
  depositing a pad oxide layer over the first STI feature;
  coating a photoresist over the pad oxide layer;
  patterning the photoresist to define the deep trench; and
  stripping the photoresist from the substrate.

15. The method of claim 13, further comprising:
  forming a first well region and a second well region in the substrate, wherein the first well region and the second well region are at opposite sides of the deep trench, and a conductivity of the second well region is different from that of the first well region.

16. The method of claim 15, further comprising:
  forming a second STI feature in the substrate;
  forming a third well region in the substrate, wherein the third well region and the second well region are at opposite sides of the second STI feature; and
  forming an emitter at the first well region, a base at the second well region and a collector at a third well region.

* * * * *